US012777882B2

(12) United States Patent
Balasubramaniam et al.

(10) Patent No.: US 12,777,882 B2
(45) Date of Patent: Oct. 27, 2026

(54) SUBSTRATE CARRIER DETECTION USING CONTACTLESS COMMUNICATION

(71) Applicant: Applied Materials, Inc., Santa Clara, CA (US)

(72) Inventors: Nithiyanantham Balasubramaniam, Leander, TX (US); Nobuyuki Kashiwagi, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 541 days.

(21) Appl. No.: 18/457,471

(22) Filed: Aug. 29, 2023

(65) Prior Publication Data

US 2025/0079209 A1 Mar. 6, 2025

(51) Int. Cl.
*H10P 72/00* (2026.01)
*H10P 72/30* (2026.01)

(52) U.S. Cl.
CPC ...... *H10P 72/0606* (2026.01); *H10P 72/0608* (2026.01); *H10P 72/3404* (2026.01); *H10P 72/3402* (2026.01)

(58) Field of Classification Search
CPC ............. H10P 72/0606; H10P 72/0608; H10P 72/3404; H10P 72/3402; H10P 72/0618
See application file for complete search history.

(56) References Cited

U.S. PATENT DOCUMENTS

2006/0043197 A1 3/2006 Chang
2012/0235793 A1 9/2012 Yi
2013/0051966 A1* 2/2013 Kim .................... H10P 72/0606 414/751.1
2015/0169039 A1* 6/2015 Teshima ................ G06F 1/1698 713/324
2019/0362995 A1 11/2019 Ito et al.
2023/0113673 A1 4/2023 Koshti et al.

FOREIGN PATENT DOCUMENTS

JP WO-2013054492 A1 * 4/2013 ............. H04L 1/244
JP 2693368 B1 * 8/2017 ....... G06K 19/07769
KR 20000055597 A * 9/2000 .......... H10P 72/3408
KR 20070000297 A * 1/2007 .......... H10P 72/0612
KR 20230094447 A 6/2023
KR 20230099270 A 7/2023
WO WO-0051921 A1 * 9/2000 .......... H10P 72/3412

OTHER PUBLICATIONS

International Search Report and Written Opinion for International Application No. PCT/US2024/010550, mailed May 20, 2024, 09 Pages.

* cited by examiner

*Primary Examiner* — Thomas Randazzo
(74) *Attorney, Agent, or Firm* — Lowenstein Sandler LLP

(57) ABSTRACT

A system includes a memory and a processing device, operatively coupled to the memory, to perform operations including receiving a signal from a reader of a contactless communication system integrated within a load port of an electronic device processing system, determining, based on the signal, whether a substrate carrier of the electronic device processing system is detected on the load port, wherein each substrate carrier of the electronic device processing system is associated with a respective tag of the contactless communication system, and in response to determining that a substrate carrier of the electronic device processing system is detected on the load port, preventing another substrate carrier from being placed on the load port.

20 Claims, 6 Drawing Sheets

SUBSTRATE CARRIER DETECTION USING CONTACTLESS COMMUNICATION

FIELD

Embodiments of the present disclosure generally relate to electronic device manufacturing systems, and more particularly relate to substrate carrier detection using contactless communication.

BACKGROUND

Processing of substrates (e.g., wafers) in electronic device manufacturing systems can be carried out in multiple process tools where the substrates travel between process tools (e.g., processing chambers) in substrate carriers such as Front Opening Unified Pods (FOUPs). The substrate carriers may be docked to a front wall of an equipment front end module (EFEM) that includes a load/unload robot. The load/unload robot is operable to transfer substrates between the substrate carriers and one or more destinations (e.g., load locks or process chambers) coupled to a rear wall of the EFEM opposite the front wall.

SUMMARY

In some embodiments, a system is provided. The system includes a memory and a processing device, operatively coupled to the memory, to perform operations including receiving a signal from a reader of a contactless communication system integrated within a load port of an electronic device processing system, determining, based on the signal, whether a substrate carrier of the electronic device processing system is detected on the load port, wherein each substrate carrier of the electronic device processing system is associated with a respective tag of the contactless communication system, and in response to determining that a substrate carrier of the electronic device processing system is detected on the load port, preventing another substrate carrier from being placed on the load port.

In some embodiments, a method is provided. The method includes receiving, by at least one processing device, a signal from a reader of a contactless communication system integrated within a load port of an electronic device processing system, determining, by the at least one processing device based on the signal, whether a substrate carrier of the electronic device processing system is detected on the load port, wherein each substrate carrier of the electronic device processing system is associated with a respective tag of the contactless communication system, and in response to determining that a substrate carrier of the electronic device processing system is detected on the load port, preventing, by the at least one processing device, another substrate carrier from being placed on the load port.

Numerous other aspects and features are provided in accordance with these and other embodiments of the disclosure. Other features and aspects of embodiments of the disclosure will become more fully apparent from the following detailed description, the claims, and the accompanying drawings.

BRIEF DESCRIPTION OF DRAWINGS

The drawings, described below, are for illustrative purposes and are not necessarily drawn to scale. The drawings are not intended to limit the scope of the disclosure in any way. Wherever possible, the same or like reference numbers will be used throughout the drawings to refer to the same or like parts.

DETAILED DESCRIPTION

Figure 1A:
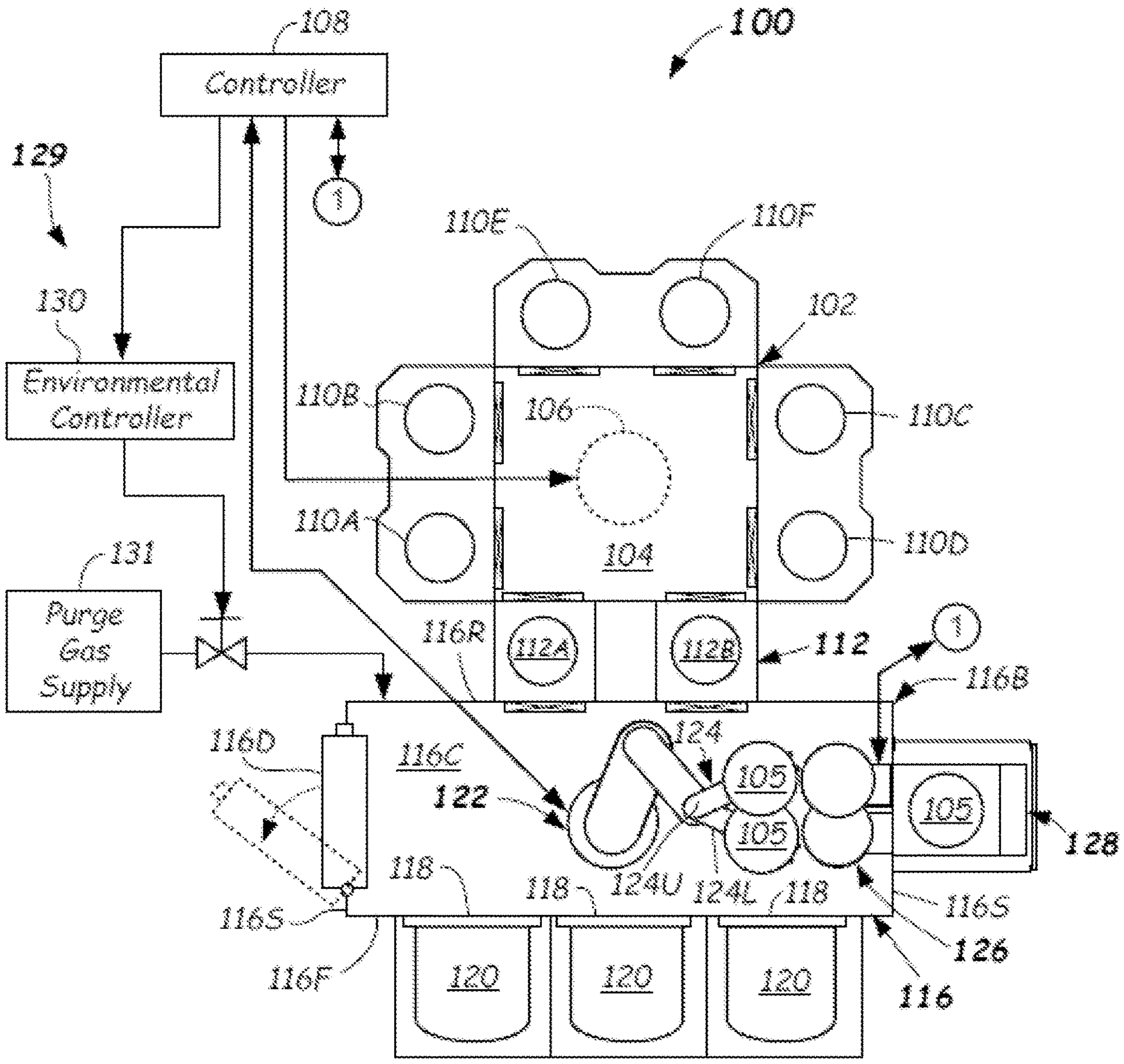
FIGS. 1A-1B are diagrams of top-down views of examples electronic device processing system including an equipment front end module (EFEM), in accordance with some embodiments.

Reference will now be made in detail to the example embodiments provided, which are illustrated in the accompanying drawings. Features of the various embodiments described herein may be combined with each other unless specifically noted otherwise.

An electronic device manufacturing system can include an equipment front end module (EFEM) to receive substrates from one or more substrate carriers. A substrate carrier, such as a FOUP, may be docked to a load port located on a front wall of the EFEM. More specifically, the load port can be configured on a front surface of an EFEM body. An EFEM may include an EFEM chamber at least partially formed by the EFEM body. In order to properly position a substrate prior to transferring the substrate to a processing chamber for processing, some EFEMs may include an alignment pedestal that rotates the substrate to a proper rotational orientation prior to processing. In some embodiments, the EFEMs may also include a side storage pod used to store substrates. For example, the side storage pod may store substrates returning from processing in the processing chamber(s). In some embodiments, the substrates may undergo degassing and/or cooling in the side storage pod. A load/unload robot may be located in an EFEM chamber and can deliver the substrates to the alignment pedestal and/or to one or more load locks or process chambers coupled on a wall of the EFEM (e.g., a rear wall thereof). In some embodiments, EFEMs include an EFEM body forming an EFEM chamber, wherein the EFEM body may include a front wall, a rear wall, and a side wall. A plurality of alignment pedestals and a load/unload robot including multiple blades may be housed within the EFEM chamber. Substrates may be transferred simultaneously from a load port and placed simultaneously onto the plurality of alignment pedestals. After the alignment pedestals align the substrates, the substrates may be simultaneously transferred from the plurality of alignment pedestals to one or more load locks or process chambers.

A load port can include a set of sensors that can be used to detect the presence of a substrate carrier (e.g., FOUP) docked on the load port. In some embodiments, a set of sensors of a load port includes one or more placement sensors that detect physical contact on the load port. In some embodiments, a set of sensors of a load port includes one or more through-beam presence sensors that detect an obstruction of a beam by an object on the load port.

It may be the case that a substrate carrier is misplaced or misaligned on a load port. If the substrate carrier is misplaced on the load port in a way that it does not cause the set of sensors to register the presence of the substrate (e.g., the placement sensor(s) fail to detect physical contact and/or the through-beam presence sensors fail to detect beam obstruction), then the set of sensors can fail to detect the presence of the substrate carrier on the load port. Failure to detect the presence of a substrate carrier on a load port can lead to substrate carrier collision if a controller, not knowing that the substrate carrier is present on the load port, causes another substrate carrier to be sent (e.g., dispatched) to the same load port.

To address these and other drawbacks, embodiments described herein can utilize contactless communication to detect substrate carriers (e.g., FOUPs) on load ports. For example, a contact communication system described herein can be used to detect when a substrate carrier is on a load port, even when the substrate carrier is misplaced on the load port in a way that would prevent detection of the substrate carrier by the set of sensors of the load port. More specifically, the contact communication system can be used to detect the presence of the substrate carrier on a load port stage, if the substrate carrier is within a threshold distance from a center position of the load port stage. The threshold distance can be determined based on the type of contactless communication system. Accordingly, the set of sensors can implement a primary substrate carrier detection method, and the contactless communication system can implement a secondary substrate carrier detection method (e.g., a backup substrate carrier detection method). In some embodiments, the contactless communication system implements a primary substrate carrier detection method. For example, the contactless communication system can completely replace sensor-based substrate carrier detection by eliminating the need to use the set of sensors. Accordingly, in some embodiments, the load port does not include a set of sensors.

A contactless communication system can include tags, with each tag being attached to (e.g., embedded within) a respective substrate carrier, and a reader (i.e., interrogator) located about a load port. For example, the reader can be located within the load port tray or stage. The reader can include a transmitter to send an interrogator signal configured to be received by a tag, referred to as an interrogator signal and/or a receiver to read a response electromagnetic signal generated by the tag in response to receiving the interrogator signal, referred to as an identifier signal. In some embodiments, the reader can include a transceiver. An identifier signal generated by the tag can include information about the corresponding substrate carrier, such as a unique substrate carrier identifier assigned to the corresponding substrate carrier, other information about the substrate carrier, etc. For example, a tag can generate an identifier signal by modulating an interrogator signal by altering its impedance or reflecting the signal back to the reader with specific patterns, encoding the information about the corresponding substrate carrier into the response. The reader can receive the identifier signal from the tag, and decode the information about the corresponding substrate carrier within the identifier signal to retrieve the data. A tag can include an antenna to receive interrogator signals and/or transmit identifier signals, and an integrated circuit to perform data processing and storage and electromagnetic signal modulation/demodulation.

In some embodiments, a tag is a passive tag that is powered by an electromagnetic signal received from a reader. In some embodiments, a tag is an active tag that is powered by an external power supply (e.g., battery) and can periodically transmit an electromagnetic signal. Active tags can be read by readers at greater distances as compared to passive tags. In some embodiments, a tag is a power-assisted passive tag (i.e., hybrid tag). Hybrid tags can include a small on-board power supply (e.g., battery) that can be used to generate an identifier signal in response to being activated by an interrogator signal.

In some embodiments, a contactless communication system is a passive-reader active-tag (PRAT) system. A PRAT system can include a passive reader that is designed to receive identifier signals from active tags that periodically transmit identifier signals. In some embodiments, a contactless communication system is an active-reader passive-tag (ARPT) system. An ARPT system can include an active reader that transmits interrogator signals to passive tags and receives identifier signals from the passive tags. In some embodiments, a contactless communication system is an active-reader active-tag (ARAT) system. An ARAT system can include an active reader that transmits interrogator signals to active tags and/or hybrid tags.

In some embodiments, a contactless communication system is implemented as a one-way communication system to enable unidirectional transmission of data. In some embodiments, a contactless communication system is implemented as a two-way communication system to enable bidirectional transmission of data.

The contactless communication system can be embodied using any suitable contactless communication technology. In some embodiments, a contactless communication system is a radio-frequency (RF) identification (RFID) system. For example, the reader can be an RFID reader and a tag can be an RFID tag. RFID can be categorized into three main types based on operating distance, including low-frequency (LF) RFID, high-frequency (HF) RFID, and ultra-high frequency (UHF) RFID. LF RFID can operate in a frequency range of about 30 kilohertz (kHz) to about 300 kHz, and HF RFID can operate in the frequency range of 3.56 about megahertz (mHz). The typical operating distance of LF RFID and/or HF RFID is usually within a few centimeters (cm) up to about 1 meter (m). UHF RFID operates in the frequency range of about 860 MHz to about 960 MHz, and can achieve longer communication distances compared to LF and HF RFID. The typical operating range UHF RFID can vary significantly, from a few meters up to tens of meters.

In some embodiments, a contactless communication system is a near-field communication (NFC) system. NFC is a short-range wireless communication technology that uses magnetic field induction to allow devices to communicate and/or exchange data when they are brought into close physical proximity, typically within a few centimeters. For example, the reader can be an NFC reader and a tag can be an NFC tag. The shorter communication range of NFC systems as compared to other contactless communication systems (e.g., Wi-Fi, Bluetooth, RFID) can ensure that data exchange occurs only when devices are in close physical proximity, providing a higher level of security compared to such other contactless communication systems. Other contactless communication systems are contemplated. Examples of other contactless communication systems include Zigbee systems, Wi-Fi systems, Bluetooth systems, etc.

A contactless communication system can implement substrate carrier detection in various ways. In some embodiments, as will be described in further detail below, a contactless communication system implements substrate carrier detection using periodic signaling. In some embodiments, a contactless communication system implements substrate carrier detection in response to detecting an event that triggers the substrate carrier detection. Further details substrate carrier detection using contactless communication will now be described below with reference to FIGS. 1A-6.

FIG. 1A illustrates a schematic top view of an electronic device processing assembly 100 including an EFEM 116 including a plurality of alignment pedestals 126 according to one or more embodiments of the disclosure. The electronic device processing assembly 100 may include a mainframe 102 including mainframe walls defining a transfer chamber 104. A transfer robot 106 (shown as a dotted circle) may be at least partially housed within the transfer chamber 104. The transfer robot 106 may be configured to place and extract substrates 105 to and from various destinations via operation of robot arms (not shown) of the transfer robot 106. Substrates 105, as used herein, includes articles used to make electronic devices or circuit components, such as semiconductor wafers, silicon-containing wafers, patterned or unpatterned wafers, glass plates, masks, and the like.

The motion of the various robot arm components of the transfer robot 106 can be controlled by suitable commands to a drive assembly (not shown) containing a plurality of drive motors commanded from a controller 108. Signals from the controller 108 may cause motion of the various robot arms of the transfer robot 106. Suitable feedback mechanisms may be provided for one or more of the robot arms by various sensors, such as position encoders, and the like. Controller 108 can include a suitable processor (e.g., microprocessor(s)), memory, drive units, and sensors that enable communication and control of the transfer robot 106 and a load/unload robot 122. Controller 108 may further control operations of other system components to be described more fully herein, such as load lock apparatus 112, process chambers 110A-110F, process chambers 110A', 110B' (FIG. 1B), slit valve doors (not shown), door openers (not shown), substrate carrier docking apparatus (not shown), and a plurality of alignment pedestals 126. The controller 108 may control other components.

The transfer robot 106 may include interconnected robot arms rotatable about a shoulder axis, which may be approximately centrally located in the transfer chamber 104, for example. Transfer robot 106 may include a base (not shown) that is configured to be attached to a chamber wall (e.g., a chamber floor) forming a lower portion of the transfer chamber 104. However, the transfer robot 106 may be attached to a ceiling in some embodiments (e.g., a chamber ceiling). The transfer robot 106 may be a dual-type robot configured to service twin chambers (e.g., side-by-side process chambers, as shown) when the transfer chamber 104 includes twinned-process chambers (as shown). Other types of process chamber orientations such as radially-oriented process chambers, as well as other types of transfer robots, such as selective compliance articulating robot arm (SCARA) robots, may be used.

The destinations for the transfer robot 106 may be one or more process chambers, such as a first process chamber set 110A, 110B, coupled to a first facet that may be configured and operable to carry out a process on the substrates 105 delivered thereto. Further destinations for the transfer robot 106 may also be a second process chamber set 110C, 110D coupled to a second facet opposite the first process chamber set 110A, 110B. Likewise, the destinations for the transfer robot 106 may also be a third process chamber set 110E, 110F coupled to a third facet that may be opposite a load lock apparatus 112.

The load lock apparatus 112 may include one or more load lock chambers (e.g., load lock chambers 112A, 112B, for example) coupled to a fourth facet. Load lock chambers 112A and 112B that are included in the load lock apparatus 112 may be single wafer load locks (SWLL) chambers, multi-wafer chambers, batch load lock chambers, or combinations thereof. For example, certain load locks, such as load lock chamber 112A, may be used for flow of substrates 105 into the transfer chamber 104, while other load lock chambers, such as load lock chamber 112B, may be used for moving substrates 105 out of the transfer chamber 104.

The process chambers 110A-110F can be configured and operable to carry out any suitable processing of the substrates 105, such as plasma vapor deposition (PVD) or chemical vapor deposition (CVD), etch, annealing, preclean, pre-heating, degassing, metal or metal oxide removal, or the like. Other deposition, removal, or cleaning processes may be carried out on substrates 105 contained therein.

Substrates 105 may be received into the transfer chamber 104 from the EFEM 116 and may also exit the transfer chamber 104 to the EFEM 116, through the load lock apparatus 112 that is coupled to one or more first walls (e.g., a rear wall 116R) of the EFEM 116. The EFEM 116 may be any enclosure having an EFEM body 116B including chamber walls, such as a front wall 116F, a rear wall 116R, side walls 116S, an upper wall 116CL (e.g., a ceiling), and a floor wall 116FL (e.g., a floor), for example, forming an EFEM chamber 116C. One of the side walls 116S may include an access door 116D that can be opened to gain access to the EFEM chamber 116C. One or more load ports 118 may be provided on one or more second walls (e.g., the front wall 116F) of the EFEM body 116B and may be configured to receive one or more substrate carriers 120 (e.g., FOUPs) thereat. Three substrate carriers 120 are shown, but more or fewer numbers of substrate carriers 120 may be docked to the EFEM 116. The load lock apparatus 112, the substrate carriers 120, and other devices that may stack substrates 105 in a vertical orientation may be collectively referred to as vertically stacked substrate storage devices.

The EFEM 116 may include a suitable load/unload robot 122 within the EFEM chamber 116C thereof. The load/unload robot 122 may include a plurality of blades 124 (e.g., dual blades) and can be configured and operational, once a door of a substrate carrier 120 is opened, such as by a door opener mechanism (not shown), to extract multiple substrates 105 from the substrate carrier 120 simultaneously. Once extracted, the blades 124 may move the substrates 105 throughout the EFEM chamber 116C, and eventually into one or more of the load lock chambers 112A, 112B of the load lock apparatus 112.

The load/unload robot 122 can be further configured to extract multiple substrates 105 from a substrate carrier 120 at a load port 118 and transfer the multiple substrates 105 simultaneously through the EFEM chamber 116C to a plurality of alignment pedestals 126. The blades 124 can be comprised of an upper blade 124U and a lower blade 124L. The upper blade 124U and lower blade 124L can be configured to a have a vertical offset 124 relative to one another. Moreover, the upper blade 124U and the lower blade 124L may be configured to be independently rotatable and/or moveable relative to one another. The alignment pedestals 126 may include devices that orient the substrates 105 to a predetermined direction. For example, the alignment pedestals 126 may optically scan the substrates 105 and identify notches (not shown) located on the substrates 105. The alignment pedestals 126 may then align the substrates 105 by rotating the substrates 105 until the notches are oriented to predetermined directions. After alignment at the plurality of alignment pedestals 126, the substrates 105 may be simultaneously transferred into one or more of the load lock chambers 112A, 112B of the load lock apparatus 112. The substrates 105 may then undergo subsequent processing in one or more of the process chambers 110A-110F.

Figure 1B:
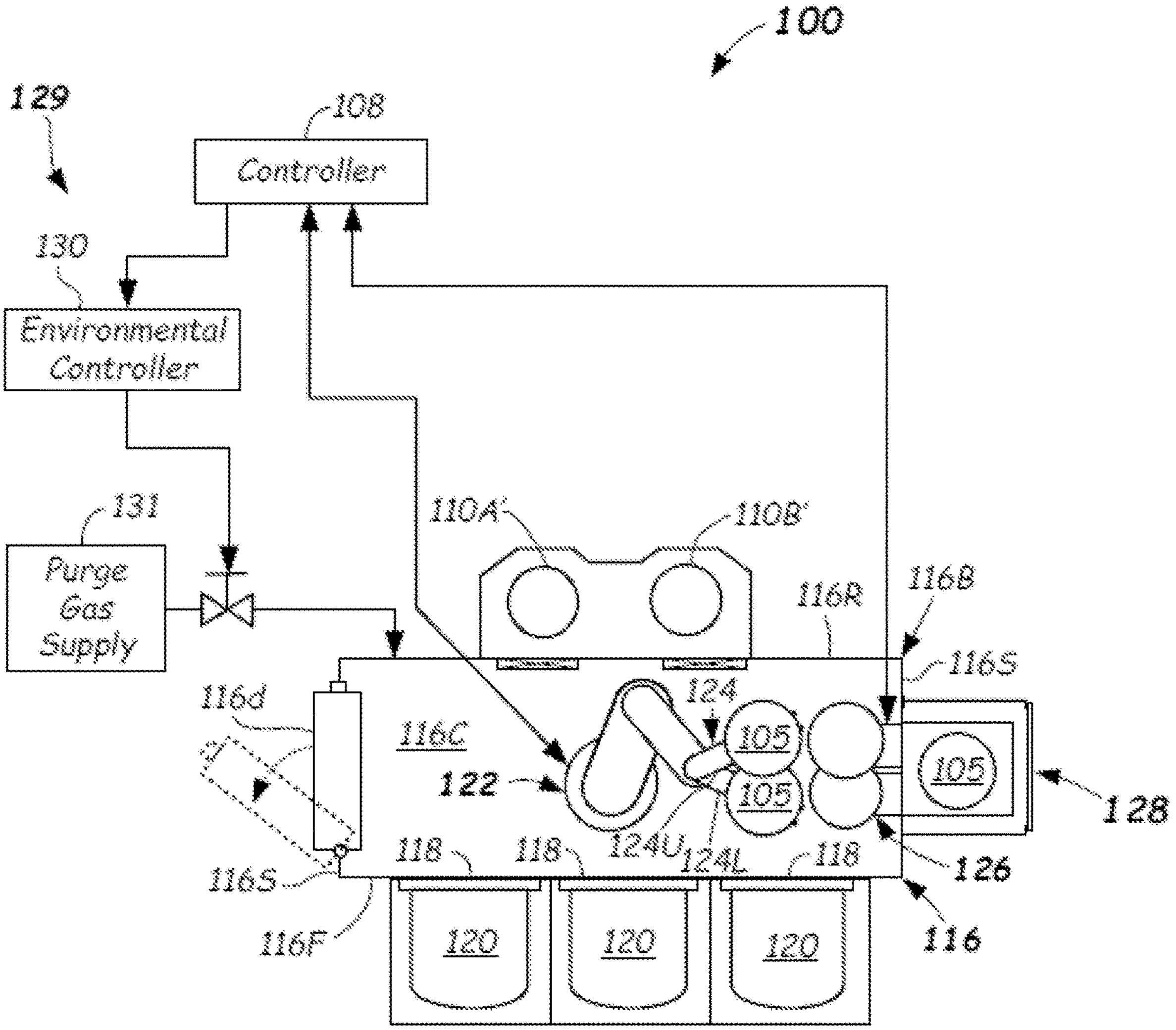

In the embodiment illustrated in FIG. 1B, process chambers 110A' and 110B' are located on the rear wall 116R of the EFEM 116. In the embodiment of FIG. 1B, after the substrates 105 are aligned at the plurality of alignment pedestals 126, the substrates 105 may be simultaneously transferred into one or more of the process chambers 110A', 110B'. For example, the blades 124 of the load/unload robot 122 may simultaneously transfer multiple substrates 105 to or from the process chambers 110A', 110B'.

The plurality of alignment pedestals 126 may be coupled to one or more walls of the EFEM 116, including the side walls 116S, the front wall 116F, and/or the rear wall 116R. Alternatively, the plurality of alignment pedestals 126 may be coupled to a floor wall 116FL (FIG. 1C) of the EFEM 116. The plurality of alignment pedestals 126 may be mounted in any suitable manner to be accessible to the blades 124 of the load/unload robot 122.

The load/unload robot 122 may be configured and operational to extract substrates 105 from the load lock apparatus 112 (or process chambers 110A', 110B' in FIG. 1B) and simultaneously transfer the substrates 105 into a side storage pod apparatus 128. For example, the transfers may occur after processing of the substrates 105 in one or more of the process chambers 110A-110F (or process chambers 110A', 110B'). In some embodiments, the load/unload robot 122 may be configured and operational to extract multiple substrates 105 from the substrate carriers 120 and simultaneously transfer the substrates 105 into the side storage pod apparatus 128 prior to processing.

The EFEM chamber 116C may be provided with an environmental control system 129 including an environmental controller 130 and a purge gas supply 131 configured to provide an environmentally-controlled atmosphere to the EFEM chamber 116C. In particular, the environmental controller 130 may be operational to monitor and/or control environmental conditions within the EFEM chamber 116C. Environmental control system 129 can include cooling devices (e.g., fans) and/or filter units to provide a positive differential pressure for EFEM chamber 116C by intaking and filtering outside air. Monitoring may be by way of one or more sensors. In some embodiments, and at certain times, the EFEM chamber 116C may receive a non-reactive gas therein, such as during processing of the substrates 105. The non-reactive gas can be an inert gas such as argon (Ar), nitrogen ($N_2$), and/or helium (He) and may be provided from the purge gas supply 131. Other gases may be used. The environmental controller 130 may interface with the controller 108 to synchronize operations within the EFEM 116. Further details regarding the load port 120 and substrate carriers (e.g., FOUPs) will now be described below with reference to FIGS. 2A-6.

Figure 2A:
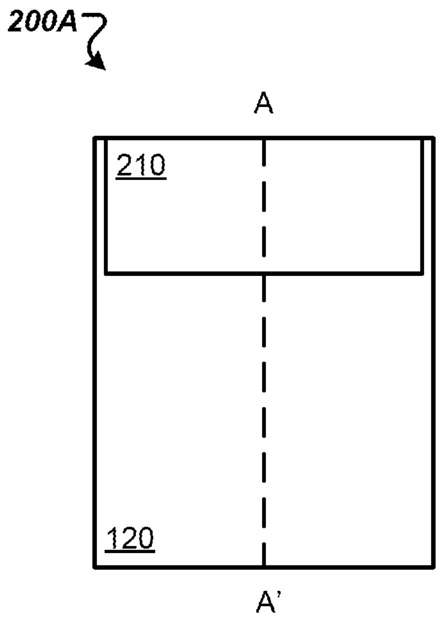
FIGS. 2A-2C are diagrams illustrating various placements of a substrate carrier on a load port, in accordance with some embodiments.
Figure 2B:
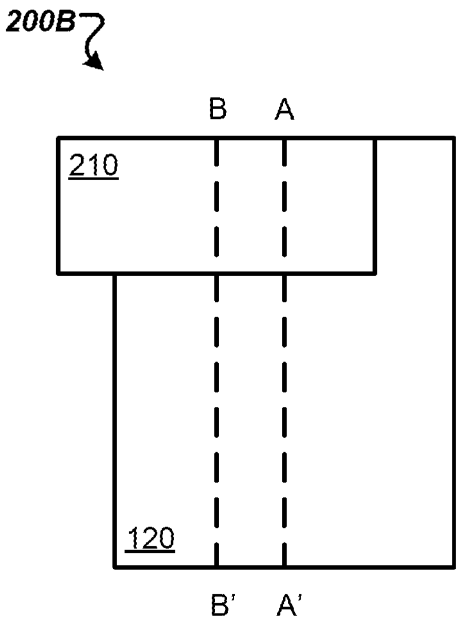
Figure 2C:
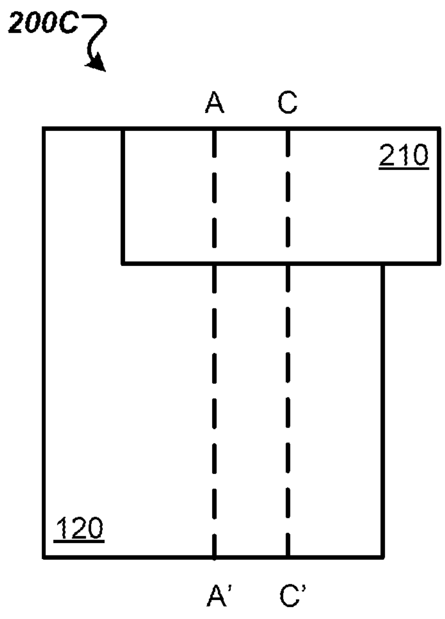

FIGS. 2A-2C are diagrams illustrating various placements of a substrate carrier 210 on a load port 120, in accordance with some embodiments. For example, FIG. 2A is a diagram 200A showing line A-A' that passes through a center region of the load port 120. In this example, line A-A' also passes through a center region of the substrate carrier 210, such that the substrate carrier 210 is approximately aligned with the load port 120 with respect to line A-A'. FIG. 2B is a diagram 200B showing line A-A' that passes through the center region of the load port 120. In this example, line B-B' passes through a center region of the substrate carrier 210. Line B-B' is not colinear with line A-A', meaning that the substrate carrier 210 is misaligned with the load port 120 with respect to line A-A'. This misalignment can be a misplacement that can cause a set of sensors of the load port 120 to fail to detect the presence of the substrate carrier 210 on the load port.

FIGS. 2A-2C illustrate examples of horizontal alignment and misalignment between the substrate carrier 210 and the load port 120. In other embodiments, the substrate carrier 210 can be vertically aligned and/or misaligned with respect to the load port 120 (e.g., with respect to a horizontal line through a center region of the load port 120). In other embodiments, the substrate carrier 210 can be rotationally aligned and/or misaligned with respect to the load port 120 (e.g., with respect to an axis line through a center region of the load port 120).

Figure 3:
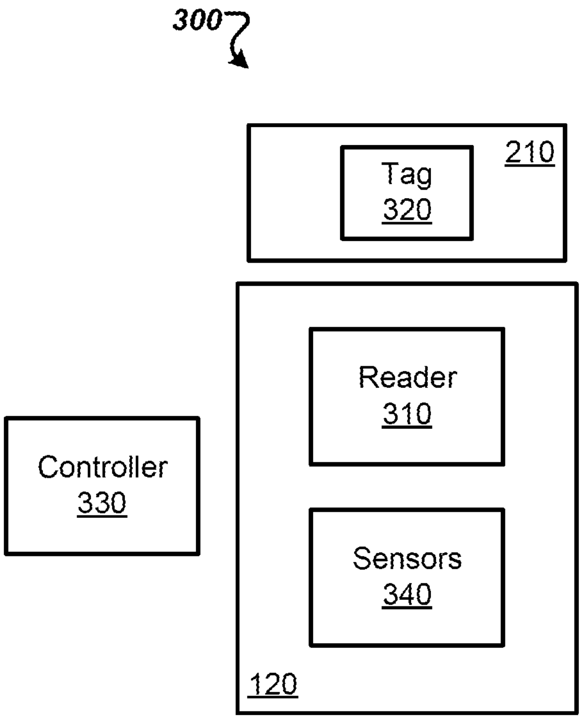
FIG. 3 is a block diagram of an example system including a substrate carrier and a load port, in accordance with some embodiments.

FIG. 3 is a block diagram of an example contactless communication system ("system") 300 including the substrate carrier 210 and the load port 120, in accordance with some embodiments. The load port 120 can include a reader 310 and the substrate carrier 210 can have a tag 320 attached thereto (e.g., embedded within the substrate carrier 210). In some embodiments, the reader 310 is placed about a load port tray or stage of the load port 120. The system 300 can further include at least one controller 330 that can be used to implement substrate carrier detection. For example, the controller 330 can be similar to the controller 108 of FIGS. 1A-1B. System 300 can be implemented using any suitable contactless communication technology that can enable contactless communication between the reader 310 and the tag 320. For example, the system 300 can include at least one of an RFID system, an NFC system, a Zigbee system, a Bluetooth system, a Wi-Fi system, etc.

For example, tag 320 can include an antenna to receive interrogator signals and/or transmit identifier signals, and an integrated circuit to perform data processing and storage and electromagnetic signal modulation/demodulation. In some embodiments, the tag 320 is a passive tag that is powered by an electromagnetic signal received from a reader. In some embodiments, the tag 320 is an active tag that is powered by an external power supply (e.g., battery) and can periodically transmit an electromagnetic signal. In some embodiments, the tag 320 is a power-assisted passive tag (i.e., hybrid tag). For example, the tag 320 can include a small on-board power supply (e.g., battery) that can be used to generate an identifier signal in response to being activated by an interrogator signal. The interrogator signal can be generated to have a frequency that can depend on various factors, such as the type of contactless communication system (RFID, NFC, etc.), location of the reader 310 and/or the tag 320 relative to the reader 310, etc.

In some embodiments, the load port 120 includes a set of sensors 340. In some embodiments, the set of sensors 340 includes one or more placement sensors that detect physical contact on the load port 120. In some embodiments, the set of sensors 340 includes one or more through-beam presence sensors that detect an obstruction of a beam by the substrate carrier 210 on the load port 120. For example, the set of sensors 340 can implement a primary substrate carrier detection method, and the system 300 implements a secondary substrate carrier detection method. In some embodiments, the system 300 can implement a primary substrate carrier detection method. For example, the system 300 can completely replace sensor-based substrate carrier detection methods by eliminating the need to use the set of sensors 340. Accordingly, in some embodiments, the load port 120 does not include the set of sensors 340.

In some embodiments, the system 300 is a PRAT system. For example, the reader 310 can be a passive reader and the tag 320 can be an active tag, and the tag 320 can periodically a transmit identifier signal to the reader 310. In some embodiments, the system 300 is an ARPT system. For example, the reader 310 can be an active reader and the tag 320 can be a passive tag, and the reader 310 can transmit an interrogator signal to the tag 320 and receive an identifier signal from the tag 320. In some embodiments, the system 300 is an ARAT system. For example, the reader 310 can be an active reader and the tag 320 can be an active tag or a hybrid tag, and the reader 310 can transmit an interrogator signal to the tag 320.

The system 300 can implement substrate carrier detection in various ways. In some embodiments, the system 300 implements substrate carrier detection using periodic signaling. For example, the reader 310 can periodically generate an interrogator signal at a particular frequency. In some embodiments, the controller 330 causes the reader 310 to periodically generate the interrogator signal. In some embodiments, the reader 310 includes an integrated circuit configured to periodically generate the interrogator signal. If the reader 310 receives a return identifier signal after generating the interrogator signal from the tag 320, that means that the substrate carrier 210 is on the load port and the system 300 knows not to place another substrate carrier on the load port 120. For example, the reader 310 can send a signal to the controller 330. Otherwise, the system 300 will know that the load port 120 is open to receive a substrate carrier. Accordingly, in these embodiments, the system 300 can be an ARPT system or an ARAT system.

As another example, the tag 320 can periodically generate an identifier signal at a particular frequency. In some embodiments, the controller 330 causes the tag 320 to periodically generate the identifier signal. In some embodiments, the tag 320 includes an integrated circuit configured to periodically generate the identifier signal. If the reader 310 receives the identifier signal, that means that the substrate carrier 210 is on the load port 310 and the system 300 knows not to place another substrate carrier on the load port 120. For example, the reader 310 can send a signal to the controller 330. Otherwise, the system will know that the load port is open to receive a substrate carrier. Accordingly, in these embodiments, the system 300 can be a PRAT system or an ARAT system.

In some embodiments, the system 300 implements substrate carrier detection in response to detecting an event. For example, the load port 120 can be configured to operate in one of a plurality of access modes. One access mode for the load port 120 is a manual mode, in which a human manually places a substrate carrier (e.g., substrate carrier 210) on the load port 120. Another access mode for the load port 120 is an automatic mode, in which a substrate carrier (e.g., substrate carrier 210) is placed on the load port 120 using an automated vehicle of a substrate carrier transportation system controlled by the controller 330.

One example of an event is a request to transition from the manual mode to the automatic mode. More specifically, in response to receiving a request to transition from the manual mode to the automatic mode, the controller 330 can initiate substrate carrier detection to determine whether a substrate carrier is detected on the load port 120 (e.g., a substrate carrier misplaced on the load port 120 that was not detected by the set of sensors 340). In some embodiments, if a substrate carrier is not detected on the load port 120, then the controller 330 can complete the transition to the automatic mode. For example, a condition of the load port 120 can be placed in a ready condition indicating that the load port 120 is ready to receive a substrate carrier.

In some embodiments, if a substrate carrier is determined to be detected on the load port 120, then the controller 330 can perform at least one remedial action. For example, performing the at least one remedial action can include the controller 330 causing the load port 120 to be placed in a "not ready" condition indicating that the load port 120 is not ready to receive a substrate carrier (e.g., an error condition). In some embodiments, performing the at least one remedial action includes the controller 330 preventing the transition from the manual mode to the automatic mode. In some embodiments, the controller 330 can complete the transition to the automatic mode regardless of the condition of the load port 120.

The controller 330 can then determine whether the substrate carrier is no longer detected on the load port 120. For example, the controller 330 can determine whether an indication of non-presence of a substrate carrier on the load port 120 has been received. In some embodiments, receiving the indication of non-presence of a substrate carrier on the load port 120 includes receiving the indication via a user interface. Additionally or alternatively, the controller 330 can cause substrate carrier detection to be performed to confirm the non-presence of the substrate carrier on the load port 120. The controller 330 can then allow the transition of the load port 120 from the manual mode to the automatic mode. Allowing the transition of the load port 120 from the manual mode to the automatic mode can include clearing the not ready condition (e.g., cause the load port 120 to enter the ready condition).

Another example of an event is determining that the load port, operating in the automatic mode, is ready to receive a substrate carrier from an automated vehicle. More specifically, the controller 330 can, prior to placing a substrate carrier on the load port 120, initiate substrate carrier detection to determine whether another substrate carrier is detected on the load port 120. If another substrate carrier is not determined to be detected on the load port 120, then the controller can allow the substrate carrier to be placed on the load port 120. For example, the load port 120 can be placed in a ready condition indicating that the load port 120 is ready to receive a substrate carrier.

If another substrate carrier is determined to be detected on the load port 120, then the controller 330 can cause the load port 120 to enter the not ready condition. The controller 330 can clear the not ready condition in response to receiving, via a user interface, an indication of non-presence of another substrate carrier on the load port 120. Additionally or alternatively, the controller 330 can cause substrate carrier detection to be performed to confirm the non-presence of the substrate carrier on the load port 120. The controller 330 can then allow a substrate carrier to be placed on the load port 120. Allowing the substrate carrier to be placed on the load port 120 can include clearing the not ready condition (e.g., cause the load port 120 to enter the ready condition).

Yet another example of an event is determining, for a load port operating in the manual mode, that the set of sensors 340 transitions from an on state (e.g., at least one sensor of the set of sensors 340 detects a substrate carrier) to an off state (e.g., each sensor of the set of sensors 340 fails to detect a substrate carrier). More specifically, the controller 330 can, in response to determining that the set of sensors 340 transitions from the on state to the off state, initiate substrate carrier detection to determine whether a substrate carrier is detected on the load port 120. In other words, the substrate carrier detection is used to determine whether a substrate carrier that was previously detected on the load port 120 has indeed been removed, or whether the substrate carrier has become misplaced in such a way that the set of sensors 340 now fails to detect the presence of the substrate carrier. If a substrate carrier is not determined to be detected on the load port 120, then the transition of the set of sensors 340 from the on state to the off state is validated. For example, the load port 120 can be placed in a ready condition indicating that the load port is ready to receive a substrate carrier. If a substrate carrier is determined to be detected on the load port 120, then the controller 330 can cause the load port 120 to enter the not ready condition). The controller 330 can clear the not ready condition in response to receiving, via a user interface, an indication of non-presence of a substrate carrier on the load port 120. Additionally or alternatively, the controller 330 can cause substrate carrier detection to be performed to confirm the non-presence of the substrate carrier on the load port 120. The controller 330 can then indicate that a substrate carrier can be placed on the load port 120. Indicating that the substrate carrier can be placed on the load port 120 can include clearing the not ready condition (e.g., cause the load port 120 to enter the ready condition). Further details regarding methods for implementing substrate carrier detection using the system 300 will now be described below with reference to FIGS. 4-5.

Figure 4:
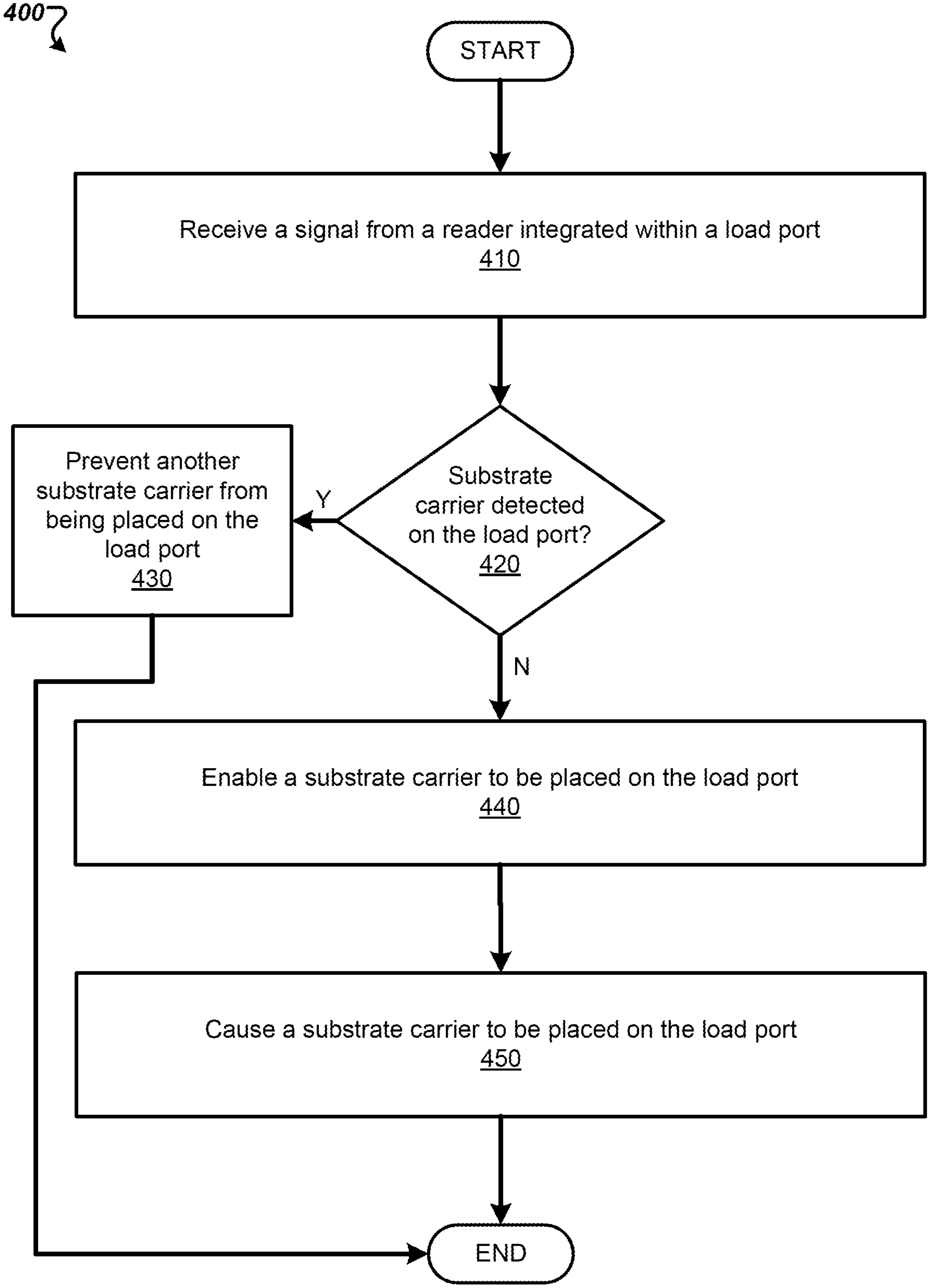
FIGS. 4-5 are flowcharts of examples method for implementing substrate carrier detection using contactless communication, in accordance with some embodiments.

FIG. 4 is a flowchart of a method 400 for implementing substrate carrier detection using contactless communication, in accordance with some embodiments. Method 400 is performed by processing logic that can include hardware (circuitry, dedicated logic, etc.), software (such as is run on a general-purpose computer system or a dedicated machine), firmware, or some combination thereof. In some implementations, method 400 is performed by at least one controller, such as controller 108 of FIG. 1 and/or controller 330 of FIG. 3. In some implementations, one or more operations of method 400 can be performed by one or more other components of an electronic device manufacturing system.

At operation 410, processing logic receives a signal from a reader integrated within a load port. More specifically, the reader can be a component of a contactless communication system. In some embodiments, the contactless communication system is an RFID system. In some embodiments, the reader is integrated within a load port tray or stage.

The signal can include data identifying whether a substrate carrier is on the load port. For example, each substrate carrier of an electronic device processing system can have a tag attached thereto that can generate an identifier signal. Each tag is a component of the contactless communication system (e.g., RFID system). If a substrate carrier is on the load port, then the reader can identify the presence of the substrate carrier on the load port by receiving an identifier signal generated by the tag attached to the substrate carrier. If a substrate carrier is not on the load port, then the reader will fail to identify the presence of the substrate carrier on the load port since there is no tag to generate the identifier signal.

In some embodiments, the identifier signal is generated in response to the tag receiving an interrogator signal from the reader. For example, the tag can be a passive tag or a hybrid tag. In some embodiments, the interrogator signal is generated periodically by the reader, as described above with reference to FIG. 3. In some embodiments, the identifier signal is generated by the tag without receiving an interrogator signal. For example, the tag can be an active tag. In some embodiments, the identifier signal is generated periodically by the tag, as described above with reference to FIG. 3. In some embodiments, the interrogator signal is generated upon detecting an event, as described above with reference to FIG. 3 and as will be described in further detail below with reference to FIG. 5.

At operation 420, processing logic determines, from the signal, whether a substrate carrier is detected on the load port. If it is determined that a substrate carrier is detected on the load port, this means that load port is not open to receiving a substrate carrier. At operation 430, processing logic can prevent another substrate carrier from being placed on the load port. For example, processing logic can prevent another substrate carrier from being dispatched to the load port. In some embodiments, preventing another substrate carrier from being placed on the load port can include setting a condition of the load port to a not ready condition. For example, if the load port had a ready condition before, then the condition can be updated to the not ready condition.

If it is determined that a substrate carrier is not detected on the load port at operation 420, this means that the load port is open to receiving a substrate carrier. At operation 440, processing logic can enable a substrate carrier to be placed on the load port (e.g., dispatched to the load port). In some embodiments, enabling a substrate carrier to be placed on the load port includes setting the condition of the load port to a ready condition. For example, if the load port had the not ready condition before, then the condition can be updated to the ready condition. At operation 450, processing logic can cause a substrate carrier to be placed on the load port (e.g., dispatched to the load port). Further details regarding operations 410-450 are described above with reference to FIGS. 1-3 and will be described in further detail below with reference to FIG. 5.

Figure 5:
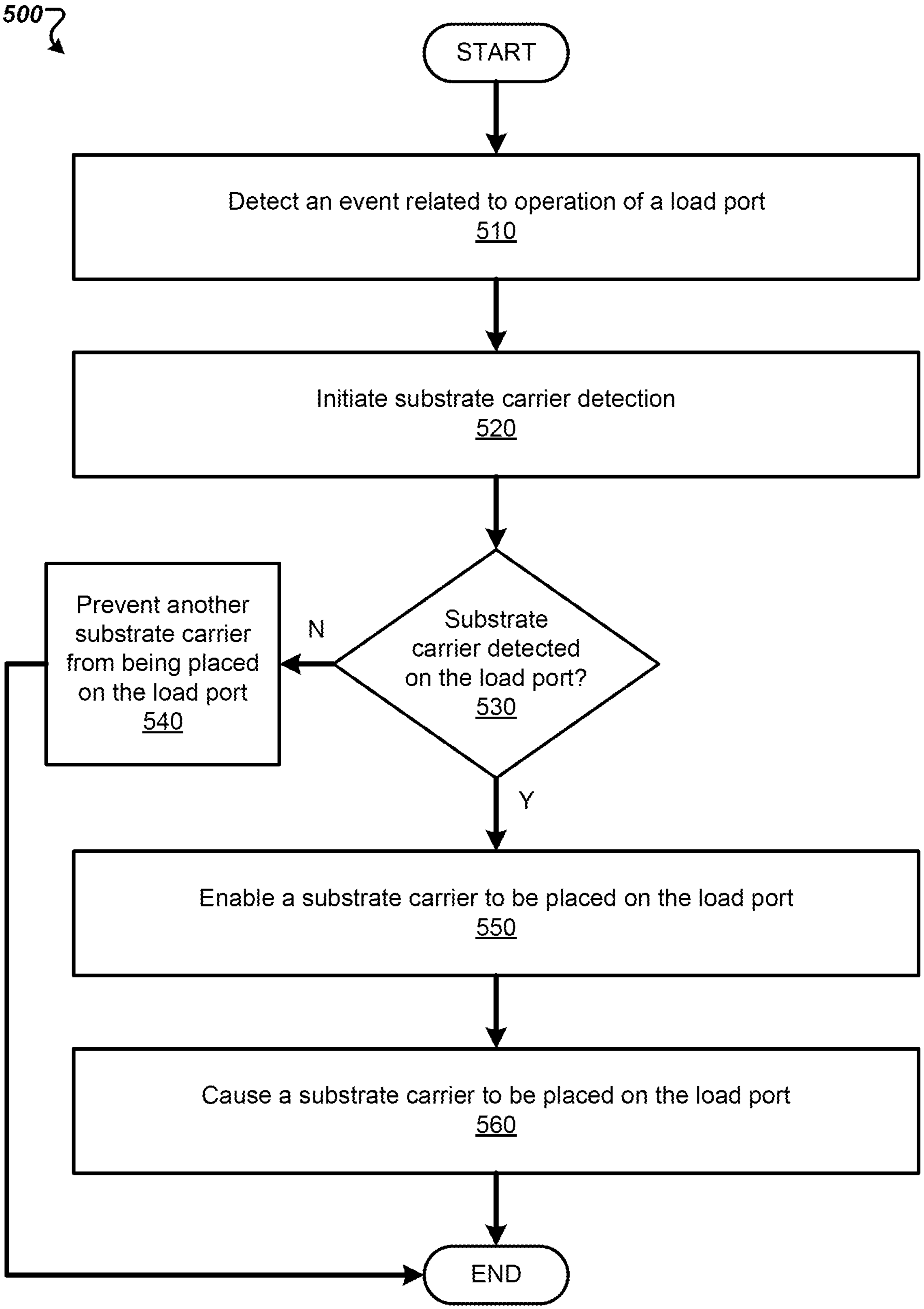

FIG. 5 is a flowchart of a method 500 for implementing substrate carrier detection using contactless communication, in accordance with some embodiments. Method 500 is performed by processing logic that can include hardware (circuitry, dedicated logic, etc.), software (such as is run on a general-purpose computer system or a dedicated machine), firmware, or some combination thereof. In some implementations, method 500 is performed by at least one controller, such as controller 108 of FIG. 1 and/or controller 330 of FIG. 3. In some implementations, one or more operations of method 500 can be performed by one or more other components of an electronic device manufacturing system.

At operation 510, processing logic detects an event related to operation of a load port. At operation 520, processing logic initiates substrate carrier detection in response to detecting the event. In some embodiments, initiating substrate carrier detection includes causing a reader integrated within the load port to generate an interrogator signal. If a substrate carrier having a tag attached thereto is on the load port, then the interrogator signal can cause the tag to generate an identifier signal.

At operation 530, processing logic determines whether a substrate carrier is detected on the load port. In some embodiments, determining whether a substrate carrier is detected on the load port includes receiving a signal from the reader. For example, the signal can be similar to the signal received at operation 410 of FIG. 4.

If it is determined that a substrate carrier is detected on the load port, this means that load port is not open to receiving a substrate carrier. At operation 540, processing logic can prevent another substrate carrier from being placed on the load port (e.g., similar to operation 430 of FIG. 4). If it is determined that a substrate carrier is not detected on the load port at operation 530, this means that the load port is open to receiving a substrate carrier. At operation 550, processing logic can enable a substrate carrier to be placed on the load port (e.g., similar to operation 440 of FIG. 4). At operation 560, processing logic can cause a substrate carrier to be placed on the load port (e.g., similar to operation 450 of FIG. 4).

For example, the load port can be configured to operate in one of a plurality of access modes. One access mode for the load port is a manual mode, in which a human manually places a substrate carrier on the load port. Another access mode for the load port is an automatic mode, in which a substrate carrier is placed on the load port using an automated vehicle of a substrate carrier transportation system.

One example of an event is a request to transition from the manual mode to the automatic mode. More specifically, in response to receiving a request to transition from the manual mode to the automatic mode, processing logic can initiate substrate carrier detection to determine whether a substrate carrier is detected on the load port (e.g., a substrate carrier misplaced on the load port that was not detected by a set of sensors of the load port). If a substrate carrier is not determined to be present, then processing logic can complete the transition to the automatic mode. For example, the load port can be placed in a ready condition indicating that the load port is ready to receive a substrate carrier.

If a substrate carrier is determined to be detected on the load port, then processing logic can prevent the transition from the manual mode to the automatic mode. For example, processing logic can cause the load port to enter a "not ready" condition indicating that the load port is not ready to receive a substrate carrier (e.g., an error condition). Processing logic can then determine whether the substrate carrier is no longer present on the load port. For example, processing logic can determine whether an indication of non-presence of a substrate carrier on the load port has been received. In some embodiments, receiving the indication of non-presence of a substrate carrier on the load port includes receiving the indication via a user interface. Additionally or alternatively, processing logic can cause substrate carrier detection to be performed to confirm the non-presence of the substrate carrier on the load port. Processing logic can then allow the transition of the load port from the manual mode to the automatic mode. Allowing the transition of the load port from the manual mode to the automatic mode can include clearing the not ready condition (e.g., cause the load port to enter the ready condition).

Another example of an event is determining that the load port, operating in the automatic mode, is ready to receive a substrate carrier from an automated vehicle. More specifically, processing logic can, prior to placing a substrate carrier on the load port, initiate substrate carrier detection to determine whether another substrate carrier is present on the load port. If another substrate carrier is not determined to be present, then processing logic can allow the substrate carrier to be placed on the load port. For example, the load port can be placed in a ready condition indicating that the load port is ready to receive a substrate carrier.

If another substrate carrier is determined to be present on the load port, then processing logic can cause the load port to enter the not ready condition. Processing logic can clear the not ready condition in response to receiving, via a user interface, an indication of non-presence of another substrate carrier on the load port. Additionally or alternatively, processing logic can cause substrate carrier detection to be performed to confirm the non-presence of the substrate carrier on the load port. Processing logic can then allow a substrate carrier to be placed on the load port. Allowing the substrate carrier to be placed on the load port can include clearing the not ready condition (e.g., cause the load port to enter the ready condition).

Yet another example of an event is determining, for a load port operating in the manual mode, that the set of sensors transitions from an on state (e.g., at least one sensor of the set of sensors detects a substrate carrier) to an off state (e.g., each sensor of the set of sensors fails to detect a substrate carrier). More specifically, processing logic can, in response to determining that the set of sensors transitions from the on state to the off state, initiate substrate carrier detection to determine whether a substrate carrier is present on the load port. In other words, the substrate carrier detection is used to determine whether a substrate carrier that was previously detected on the load port has indeed been removed, or whether the substrate carrier has become misplaced in such a way that the set of sensors now fails to detect the presence of the substrate carrier. If a substrate carrier is not determined to be present on the load port, then the transition of the set of sensors from the on state to the off state is validated. For example, the load port can be placed in a ready condition indicating that the load port is ready to receive a substrate carrier. If a substrate carrier is determined to be present on the load port, then processing logic can cause the load port to enter the not ready condition). Processing logic can clear the not ready condition in response to receiving, via a user interface, an indication of non-presence of a substrate carrier on the load port. Additionally or alternatively, processing logic can cause substrate carrier detection to be performed to confirm the non-presence of the substrate carrier on the load port. Processing logic can then indicate that a substrate carrier can be placed on the load port. Indicating that the substrate carrier can be placed on the load port can include clearing the not ready condition (e.g., cause the load port to enter the ready condition). Further details regarding operations 510-560 are described above with reference to FIGS. 1-4.

Figure 6:
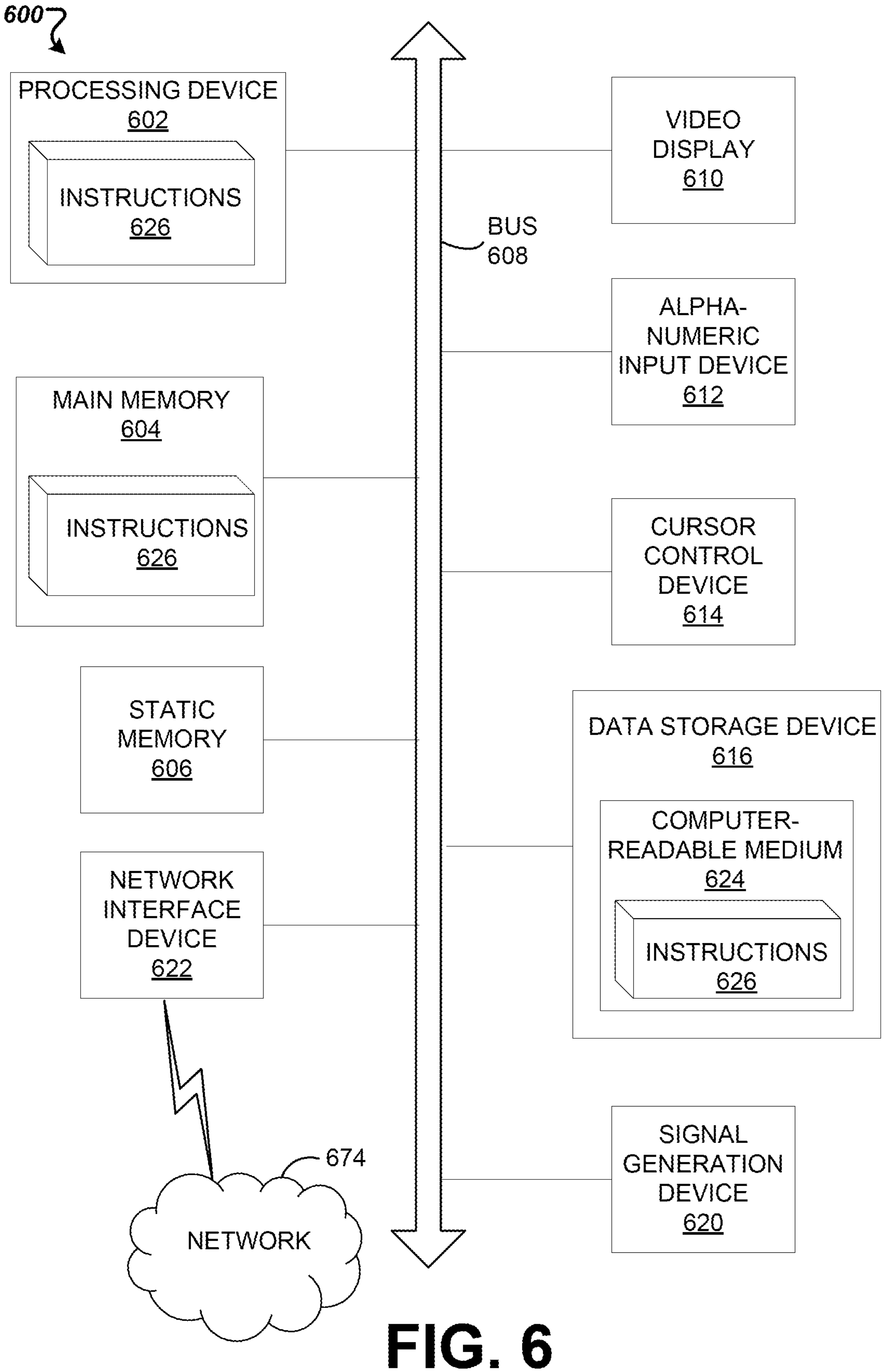
FIG. 6 is a block diagram illustrating a computer system, in accordance with some embodiments.

FIG. 6 is a block diagram illustrating a computer system 600, according to certain implementations. In some implementations, computer system 600 can be connected (e.g., via a network, such as a Local Area Network (LAN), an intranet, an extranet, or the Internet) to other computer systems. Computer system 600 can operate in the capacity of a server or a client computer in a client-server environment, or as a peer computer in a peer-to-peer or distributed network environment. Computer system 600 can be provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, computer system 600 can include processing device 602, volatile memory 604 (e.g., random-access memory (RAM)), non-volatile memory 606 (e.g., read-only memory (ROM) or electrically-erasable programmable ROM (EEPROM)), and data storage device 616, which can communicate with each other via bus 608.

Processing device 602 can be provided by one or more processors such as a general purpose processor (such as, for example, a complex instruction set computing (CISC) microprocessor, a reduced instruction set computing (RISC) microprocessor, a very-long instruction word (VLIW) microprocessor, a microprocessor implementing other types of instruction sets, or a microprocessor implementing a combination of types of instruction sets) or a specialized processor (such as, for example, an application-specific integrated circuit (ASIC), a field-programmable gate array (FPGA), a digital signal processor (DSP), or a network processor).

Computer system 600 can further include network interface device 622 (e.g., coupled to network 674). Computer system 600 also can include video display unit 610 (e.g., an LCD), alphanumeric input device 612 (e.g., a keyboard), cursor control device 614 (e.g., a mouse), and signal generation device 620.

In some implementations, data storage device 616 can include non-transitory computer-readable storage medium ("computer-readable medium") 624 on which can store instructions 626 encoding any one or more of the methods or functions described herein, including methods or functions implemented by controller 108, controller 330, reader 310 and/or tag 320.

Instructions 626 can also reside, completely or partially, within volatile memory 604 and/or within processing device 602 during execution thereof by computer system 600, hence, volatile memory 604 and processing device 602 can also constitute machine-readable storage media.

While computer-readable storage medium 624 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein can be implemented by discrete hardware components or can be integrated in the functionality of other hardware components such as ASICS, FPGAs, DSPs or similar devices. In addition, the methods, components, and features can be implemented by firmware modules or functional circuitry within hardware devices. Further, the methods, components, and features can be implemented in any combination of hardware devices and computer program components, or in computer programs.

Unless specifically stated otherwise, terms such as "receiving," "performing," "providing," "obtaining," "causing," "accessing," "determining," "adding," "using," "training," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and cannot have an ordinal meaning according to their numerical designation.

Examples described herein also relate to an apparatus for performing the methods described herein. This apparatus can be specially constructed for performing the methods described herein, or it can include a general purpose computer system selectively programmed by a computer program stored in the computer system. Such a computer program can be stored in a computer-readable tangible storage medium.

The methods and illustrative examples described herein are not inherently related to any particular computer or other apparatus. Various general purpose systems can be used in accordance with the teachings described herein, or it can prove convenient to construct more specialized apparatus to perform methods described herein and/or each of their individual functions, routines, subroutines, or operations. Examples of the structure for a variety of these systems are set forth in the description above.

It should be readily appreciated that the present disclosure is susceptible of broad utility and application. Many embodiments and adaptations of the present disclosure other than those herein described, as well as many variations, modifications, and equivalent arrangements, will be apparent from, or reasonably suggested by, the present disclosure and the foregoing description thereof, without departing from the substance or scope of the present disclosure. Accordingly, while the present disclosure has been described herein in detail in relation to specific embodiments, it is to be understood that this disclosure is for illustrative purposes and presents examples of the present disclosure and is made merely for purposes of providing a full and enabling disclosure. This disclosure is not intended to be limited to the particular apparatus, assemblies, systems and/or methods disclosed, but, to the contrary, the intention is to cover all modifications, equivalents, and alternatives falling within the scope of the claims.

What is claimed is:

1. A system comprising:

a memory; and at least one processing device, operatively coupled to the memory, to perform operations comprising:

receiving a signal from a reader of a contactless communication system integrated within a load port of an electronic device processing system, wherein the contactless communication system comprises a radio-frequency identification (RFID) system or a near-field communication (NFC) system;

determining, based on the signal, whether a substrate carrier of the electronic device processing system is detected on the load port, wherein each substrate carrier of the electronic device processing system is associated with a respective tag of the contactless communication system, the respective tag being embedded within the substrate carrier; and in response to determining that a substrate carrier of the electronic device processing system is detected on the load port, preventing another substrate carrier from being placed on the load port.

2. The system of claim 1, wherein preventing another substrate carrier from being placed on the load port comprises setting a condition of the load port to a not ready condition indicating that the load port is not ready to receive another substrate carrier.

3. The system of claim 1, wherein the load port further comprises a set of sensors comprising at least one of: a placement sensor or a through beam sensor.

4. The system of claim 1, wherein the operations further comprise:

in response to determining that a substrate carrier of the electronic device processing system is not detected on the load port, enabling a given substrate carrier to be placed on the load port; and causing the given substrate carrier to be placed on the load port.

5. The system of claim 4, wherein enabling the given substrate carrier to be placed on the load port comprises setting a condition of the load port to a ready condition indicating that the load port is ready to receive another substrate carrier.

6. The system of claim 1, wherein the operations further comprise:

detecting an event related to operation of the load port; and in response to detecting the event, initiating substrate carrier detection by causing the reader to generate an interrogator signal.

7. The system of claim 6, wherein the event is associated with a set of access modes of the load port.

8. The system of claim 7, wherein the event is a transition from a manual mode of the set of access modes to an automatic mode of the set of access modes.

9. The system of claim 7, wherein the load port is operating in an automatic mode of the set of access modes, and wherein the event is a determination that the load port is ready to receive a substrate carrier.

10. The system of claim 7, wherein the load port is operating in a manual mode of the set of access modes, and wherein the event is a determination that a set of sensors of the load port transitions from an on state corresponding to detection of a substrate carrier on the load port to an off state corresponding to failure to detect a substrate carrier on the load port.

11. A method comprising:

receiving, by at least one processing device, a signal from a reader of a contactless communication system integrated within a load port of an electronic device processing system, wherein the contactless communication system comprises a radio-frequency identification (RFID) system or a near-field communication (NFC) system;

determining, by the at least one processing device based on the signal, whether a substrate carrier of the electronic device processing system is detected on the load port, wherein each substrate carrier of the electronic device processing system is associated with a respective tag of the contactless communication system, the respective tag being embedded within the substrate carrier; and in response to determining that a substrate carrier of the electronic device processing system is detected on the load port, preventing, by the at least one processing device, another substrate carrier from being placed on the load port.

12. The method of claim 11, wherein preventing another substrate carrier from being placed on the load port comprises setting a condition of the load port to a not ready condition indicating that the load port is not ready to receive another substrate carrier.

13. The method of claim 11, wherein the load port further comprises a set of sensors comprising at least one of: a placement sensor or a through beam sensor.

14. The method of claim 11, further comprising:

in response to determining that a substrate carrier of the electronic device processing system is not detected on the load port, enabling a given substrate carrier to be placed on the load port; and causing the given substrate carrier to be placed on the load port.

15. The method of claim 14, wherein enabling the given substrate carrier to be placed on the load port comprises setting a condition of the load port to a ready condition indicating that the load port is ready to receive another substrate carrier.

16. The method of claim 11, further comprising:

detecting an event related to operation of the load port; and in response to detecting the event, initiating substrate carrier detection by causing the reader to generate an interrogator signal.

17. The method of claim 16, wherein the event is associated with a set of access modes of the load port.

18. The method of claim 17, wherein the event is a transition from a manual mode of the set of access modes to an automatic mode of the set of access modes.

19. The method of claim 17, wherein the load port is operating in an automatic mode of the set of access modes, and wherein the event is a determination that the load port is ready to receive a substrate carrier.

20. The method of claim 17, wherein the load port is operating in a manual mode of the set of access modes, and wherein the event is a determination that a set of sensors of the load port transitions from an on state corresponding to detection of a substrate carrier on the load port to an off state corresponding to failure to detect a substrate carrier on the load port.

* * * * *